United States Patent [19]
Nishida et al.

[11] Patent Number: 5,392,014
[45] Date of Patent: Feb. 21, 1995

[54] FREQUENCY MULTIPLIER

[75] Inventors: Haruki Nishida; Yoshiaki Nakano; Shin Watanabe, all of Kawasaki, Japan

[73] Assignee: Fujitsu Limited, Kawasaki, Japan

[21] Appl. No.: 24,295

[22] Filed: Mar. 1, 1993

[30] Foreign Application Priority Data

Mar. 2, 1992 [JP] Japan ..................... 4-44667

[51] Int. Cl.⁶ .............................................. H01P 1/20
[52] U.S. Cl. ................................... 333/218; 327/122; 327/123; 327/119
[58] Field of Search ............... 333/218, 109, 117, 120, 333/121; 328/16, 19, 20; 363/157, 163

[56] References Cited

U.S. PATENT DOCUMENTS

| | | | |
|---|---|---|---|
| 3,329,884 | 7/1967 | Gewartowski | 333/117 X |
| 4,327,343 | 4/1982 | Cornish | 333/218 |
| 4,531,105 | 7/1985 | Kumer | 333/218 X |
| 4,673,898 | 6/1987 | Redmond | 333/109 |
| 4,734,591 | 3/1988 | Ichitsubo | 333/218 X |

FOREIGN PATENT DOCUMENTS 61-156905  7/1986  Japan .

*Primary Examiner*—Paul Gensler
*Attorney, Agent, or Firm*—Armstrong, Westerman, Hattori, McLeland & Naughton

[57] ABSTRACT

An input signal specified by an input frequency is divided by an out-of-phase type input hybrid coupler, into two divided signals with regard to the power of the input signal, where the divided signals have different phases. The input frequency of each of the divided signals is multiplied by a frequency multiplier connected with the input hybrid coupler, producing frequency multiplied signals each specified by the multiplied frequency. The frequency multiplied signals are composed by an out-of-phase type output hybrid coupler with regard to power, producing an output signal specified by the multiplied frequency. A phase shifter is provided between the input and the output hybrid coupler for varying the phase difference between the frequency multiplied signals, so that the frequency multiplied signals are composed in in-phase.

12 Claims, 8 Drawing Sheets

FREQUENCY MULTIPLIER

BACKGROUND OF THE INVENTION

1. Field of the Invention

The present invention relates to a frequency multiplier and, in particular, to a power composed type frequency multiplier.

The power composed type frequency multiplier is used for a local oscillator or a multiplier of a transmitting radio frequency (RF) in the microwave or millimeter wavelength range. In the power composed type frequency multiplier, the frequency multiplication is performed by: dividing the input signal into two divided signals each having half the power of the input signal; multiplying the input frequency of the divided signal respectively; and composing the power of the divided signals into output power of an output signal of the power composed frequency multiplier, specified by the multiplied frequency so that the output power is approximately the same as the input power.

2. Description of the Related Art

At the RF in the microwave or millimeter wavelength range, the frequency multiplication is performed by using a non-linear element and a micro strip line connected with the non-linear element. FIG. 1 is a schematic block diagram of a typical frequency multiplier 101 for such RF. The frequency multiplier 101 includes an FET 112 used as the non-linear element and a micro strip line (MS) 113 connected with FET 112. An input signal specified by a frequency "f" is sent to a gate electrode G of FET 112 through a matching network (MN) 111. The input signal is amplified by FET 112, producing an output signal from its drain electrode D to MS 113.

The MS 113 consists of an MS 113a and an MS 113b connected with MS 113a at a point Q located a quarter wavelength ($\lambda/4$) of frequency f far from an entrance of MS 113a. MS 113b has an open stub at $\lambda/4$ far from point Q. Therefore, when the output signal from the drain electrode D specified by frequency f is transmitted toward point Q through MS 113a, the output signal is reflected back to the drain electrode D, at point Q because of the open stub of MS 113b. As a result, the reflected signal and a succeeding output signal from the drain electrode D are combined at the drain electrode D in-phase and added to a source electrode (S) of FET 112 as an excessive signal for FET 112. This results in the saturation of FET 112, so that higher harmonics such as second harmonics ($2f$) and third harmonics ($3f$) are generated in FET 112. Since point Q acts as an open strip line for frequency $2f$, the $2f$ signal is directly transfered to an MN 114 through point Q, but the $3f$ signal is reflected back to the drain electrode D at point Q, as well as fundamental frequency f. Because point Q act as a short strip line for the $3f$ signal only, the $2f$ signal is extracted from frequency multiplier 101 through MN 114.

Though frequency multiplier 101 includes FET 112, FET 112 is used only as the non-linear element for obtaining the higher harmonics. The power gain cannot be expected to be obtained from FET 112. Generally, in an RF in the microwave or millimeter wavelength range, it is difficult to realize RF generation or amplification by a semiconductor device due to technology and costs. Therefore, the power composed type frequency multiplier is very important as a last stage for RF generation. As a result, it is important to protect the power gains from being reduced due to the effect of frequency multiplication. The power composed frequency multiplication process accomplishes this purpose.

In the power composed type frequency multiplier, the following way is used for the frequency multiplication generally: an input signal specified by an input frequency f is divided into two divided signals each having half the power of the input signal; the frequency multiplication is performed to the divided signals respectively so that the input frequency of each divided signal is multiplied to, for example, $2f$; and the divided signals specified by $2f$ respectively are composed so as to produce the output signal of the power composed type frequency multiplier specified by $2f$ and having output power approximately the same as the power of the input signal.

Wherein, in order to distinguish the frequency multiplier not performing power composition from the power composed type frequency multiplier, the frequency multiplier, such as the frequency multiplier 101 shown in FIG. 1, will be called "usual frequency multiplier" hereinafter.

FIG. 2 is a block diagram for illustrating a power composed type frequency multiplier 200 in the prior art. In FIG. 2, reference numerals 101a and 101b are the usual frequency multipliers each being the same as the usual frequency multiplier 101 in FIG. 1, except that step recovery diodes or varactor diodes 23a and 23b are used as the non-linear elements. In order to divide and compose power, well known Wilkinson type hybrid couplers (HYBs) 121 and 125 are used, respectively, and usual frequency multipliers 101a and 101b are provided between HYBs 121 and 125.

The Wilkinson type HYBs 121 and 125 are what are called in-phase hybrid couplers (IN-PHASE HYB). The IN-PHASE HYB 121 has a feature of producing two divided signals in-phase on their frequencies, and IN-PHASE HYB 125 has a feature of composing two input signals into a composed output signal when the two input signals are in-phase.

The IN-PHASE HYB 121 consists of: an input micro strip line having characteristic impedance $Z_0$ and providing an input terminal ①; two $\lambda/4$ length micro strip lines having impedance $(2)^{\frac{1}{2}} \cdot Z_0$ and providing output terminals ② and ③ respectively; and a terminating resistor R having resistance of $2 Z_0$, provided between the output terminals ② and ③. The IN-PHASE HYB 125 is also the in-phase hybrid coupler having construction the same as IN-PHASE HYB 121. The power composed type frequency multiplier 200 is for doubling an input frequency f, so that a composed output signal from IN-PHASE HYB 125 is specified by $2f$.

In FIG. 2, when an input signal $S_{in}$ (f) specified by input frequency f is input to input terminal ①, the power of $S_{in}$ (f) is divided into two halves output from output terminals ② and ③, respectively, so as to be in-phase with each other. The output signals from output terminals ② and ③ are sent to usual frequency multipliers 101a and 101b in which frequency f of the output signals from output terminals ② and ③ are doubled respectively. The usual frequency multiplier 101a consists of: MN 111a the same as MN 111; a step recovery diode or a varactor diode 112a used as the non-linear element same as FET 112; and MN 113a including a micro strip line the same as MS 113 and a matching network same as MN 114 in FIG. 1. The constitution and function of usual frequency multiplier 101b are same as those of usual frequency multiplier 101a. Therefore, usual frequency multipliers 101a and 101b produce frequency multiplied output signals specified by multiplied frequency 2f in-phase.

The frequency multiplied output signals from usual frequency multipliers 101a and 101b are sent to input terminals ④ and ⑤ of IN-PHASE HYB 125. The construction and function of IN-PHASE HYB 125 are the same as those of IN-PHASE HYB 121 except that the flow of signals is reversed to that in IN-PHASE HYB 121, so that the power of the input signals to IN-PHASE HYB 125 specified by frequency 2f in in-phase is composed by IN-PHASE HYB 125 so as to produce an output signal $S_{out}(2f)$ specified by frequency 2f.

However, when reflected signals are reflected back to terminals ② and ③ of HYB 121 from usual frequency multipliers 101a and 101b respectively, some of the reflected power is absorbed in terminating resistor R, but the rest of the reflected power appears at input terminal ① in-phase because of the characteristics of the in-phase hybrid coupler, which results in making the input impedance of power composed type frequency multiplier 200 unstable, producing power loss. Wherein, the power reflection cannot be avoided occurring at usual frequency multipliers 101a and 101b because the device impedance of diodes 112a and 112b changes corresponding to the change of the input level to diodes 112a and 112b. The same power reflection occurs in the case of an FET, such as FET 112 in FIG. 1. That is, when FET 112 is saturated, the reverse isolation $S_{12}$ kept between the drain electrode D and G is fails. As a result, the power reflected from open stub 113b flows to the gate electrode G through the drain electrode D and appears at the input terminal of usual frequency multiplier 101 through MN 111. Therefore, the reflected power is reflected back to the in-phase type hybrid coupler from the usual frequency multiplier, including the FET.

Similar to the case of IN-PHASE HYB 121, the power loss is produced due to IN-PHASE HYB 125. When the reflected signal is reflected to IN-PHASE HYB 125 from a succeeding circuit, not depicted in FIG. 2, of power composed frequency multiplier 200, the reflected signal makes the output impedance of IN-PHASE HYB 125 unstable similar to IN-PHASE HYB 121, which causes IN-PHASE HYB 125 to exhibit a power loss.

As stated above, in the power composed type frequency multiplier in the prior art, Wilkinson type HYBs have been used for dividing and composing the power. This is because the Wilkinson type HYB is easy to use because the Wilkinson type HYB is an in-phase type HYB. However, applying the in-phase type HYB to the input and output HYBs respectively, causes occurrence of input and output impedance mismatch, producing a large power loss due to the frequency multiplication. This has been a problem in the prior art.

SUMMARY OF THE INVENTION

Therefore, an object of the present invention is to improve the power composed type frequency multiplier so as to decrease the power loss produced during the power composed frequency multiplication.

The above object is achieved by improving the input and output impedance matching on the power composed type frequency multiplier by applying an out-of-phase type HYB to the input and the output HYBs of the power composed type frequency multiplier respectively.

Applying the out-of-phase type HYB to the input HYB, the reflected signals produced by the succeeding circuits connected with two output terminals of the input HYB are reduced or cancel out each other at an input terminal of the input HYB because of the phase relation between the reflected signals appearing at the input terminal. Then, the input impedance of the input HYB becomes stable.

Applying the out-of-phase type HYB to the output HYB, the reflected signal reflected from a succeeding circuit of the power composed type frequency multiplier, connected with an output terminal of the output HYB is reduced or extinguished at the output terminal. Because, the reflected signal is divided into two divided signals by the output HYB, the two divided signals are output from input terminals of the output HYB and reflected back to the input terminals by preceding circuit of the output HYB as returned signals, and the returned signals are reduced or cancel out each other at the output terminal because of the phase relation which is the same as that of the reflected signals, are reduced or cancel out each other in the input HYB. This results in making the output impedance stable.

The frequency multiplication is performed by the usual frequency multipliers connected between the input and output HYBs. However, applying the out-of-phase type HYB to the input and the output impedance respectively, the phase difference between the frequency multiplied signals must be changed for composing the power of the frequency multiplied signals. A phase shifter made of a micro strip line behind which is laid an electric conductor is provided between the input and output HYBs for correcting the phase difference.

Applying thus the out-of-phase type HYB to the input and output HYBs respectively, the input and output impedance become stable. As a result, the power loss having been produced in the prior art power composed type frequency multiplier is improved as much as 3 dB.

DESCRIPTION OF THE PREFERRED EMBODIMENT

Figure 3:
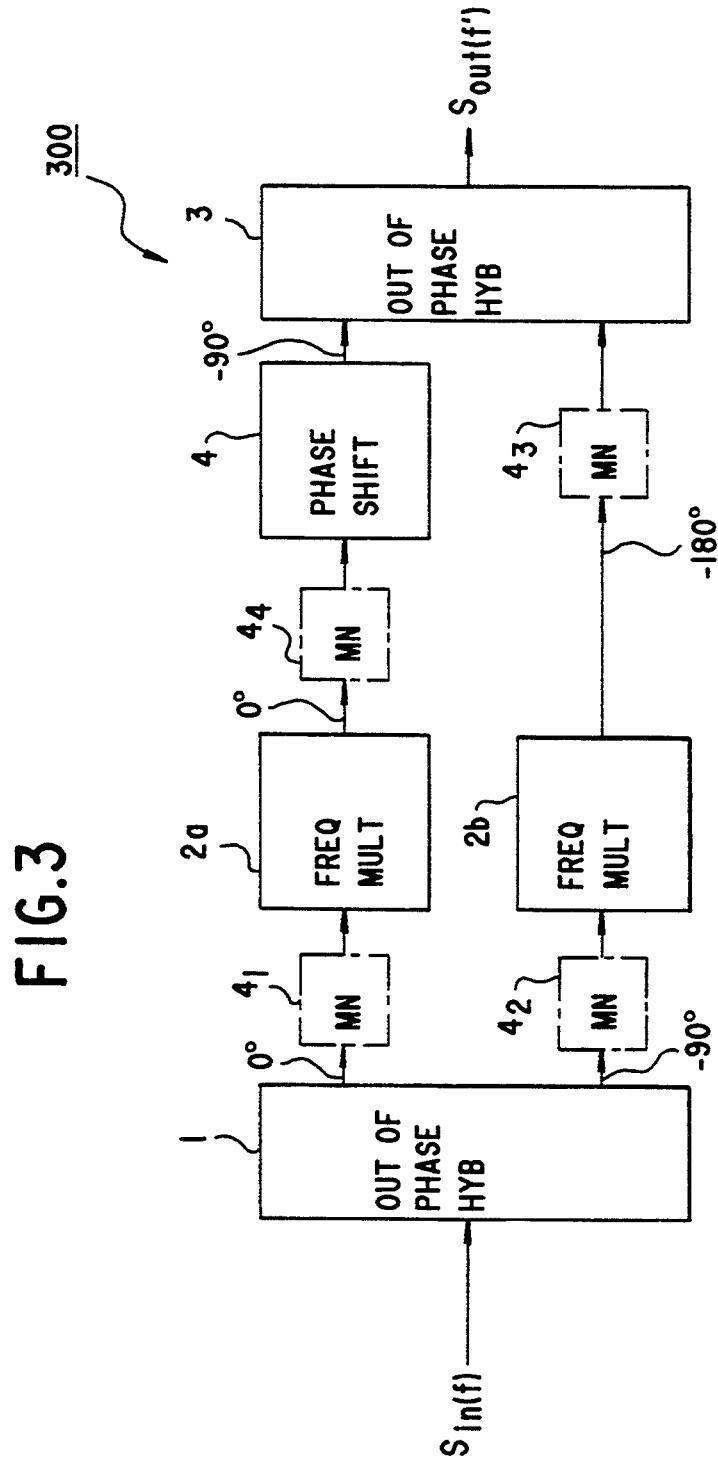
FIG. 3 is a block diagram for illustrating a principle of the present invention.

FIG. 3 is a block diagram of a power composed type frequency multiplier (POWER COMP FREQ MULT) 300 illustrating a principle of the present invention. The POWER COMP FREQ MULT 300 consists of: an out-of-phase type HYB (OUT-OF-PHASE HYB) 1 used as the input HYB for dividing the power of input signal $S_{in}$ (f) specified by an input frequency f, into two divided signals being out-of-phase with each other; usual frequency multipliers (FREQ MULTs) 2a and 2b for multiplying frequency f of each divided signal to multiplied frequency f', respectively, producing frequency multiplied signals; an output HYB 3 for composing the power of the frequency multiplied signals to an output signal $S_{out}$ (f') of POWER COMP FREQ MULT 300; a phase shifter (PHASE SHIFT) 4 provided between HYB 1 and HYB 3 for shifting a phase of one of the frequency multiplied signals so that the power composition is performed by HYB 3 in-phase; and matching networks (MNs) $4_1$ to $4_4$ provided for matching impedance between units connected to each MN, wherein MNs $4_1$ to $4_4$ are depicted by dotted chain boxes because some of MNs $4_1$ to $4_4$ can be omitted to be provided for avoiding the power loss increasing due to the some matching networks.

Figure 4:
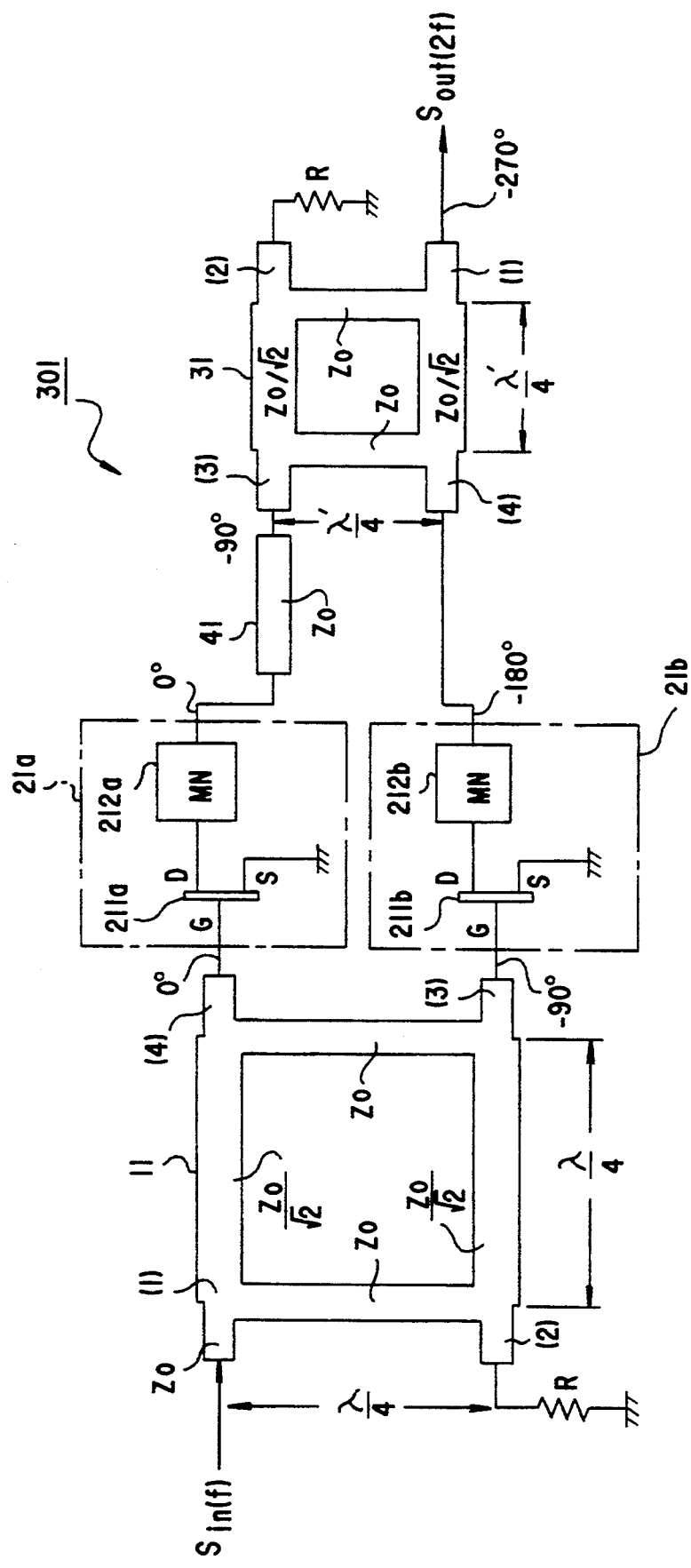
FIG. 4 is a block diagram of a power composed type frequency multiplier employing a first embodiment of the present invention.

FIG. 4 is a block diagram of POWER COMP FREQ MULT 301 showing the first embodiment the present invention. In FIG. 4, the same reference numeral as in FIG. 3 designates the same unit as in FIG. 3, and the same symbol as in FIGS. 1 and 2 designates the same part as in FIGS. 1 and 2. As shown in FIG. 4, POWER COMP FREQ MULT 301 consists of: a branch-line type HYB 11 corresponding to OUT-OF-PHASE HYB 1 in FIG. 3; a branch-line type HYB 31 corresponding to OUT-OF-PHASE HYB 3 in FIG. 3; FREQ MULTs 21a and 21b corresponding to FREQ MULTs 2a and 2b in FIG. 3 respectively; and PHASE SHIFT 41 corresponding to PHASE SHIFT 4 in FIG. 3.

The branch-line type HYB 11 consists of: an input terminal ① having characteristic impedance $Z_0$; four branched strip-lines consisting of two branched λ/4 length strip-lines each having impedance $Z_0/(2)^{\frac{1}{2}}$ and two branched λ/4 length strip-lines each having impedance $Z_0$; terminal ② connected with a termination resistor R, and output terminals ④ and ③.

In HYB 11, the input power of an input signal $S_{in}$ (f) specified by an input frequency f is divided in two and the divided signals are output from output terminals ④ and ③ respectively so that the phase of the output signal at terminal ③ is delayed 90° from that at terminal ④. When the divided signals output from terminals ④ and ③ are reflected from FREQ MULTs 21a and 21b to terminals ④ and ③, respectively, the reflected signal at terminal ③ is delayed 90° from the reflected signal at terminal ④. Therefore, the phase of the reflected signal entering through terminal ④ is delayed 90° but the phase of the reflected signal entered through terminal ③ is delayed 270°, at terminal ①, producing 180° phase difference at terminal ①. This teaches that the reflected signals entering from terminals ④ and ③ cancel out each other, which means that no reflected signal appears at input terminal ①. Other parts of the reflected signals appearing at terminal ② are absorbed by termination resistor R. Therefore, because of providing branch-line type HYB 11 to the input HYB, the input impedance becomes stable and the power loss due to the impedance mismatch can be decreased at the input terminal.

Figure 1:
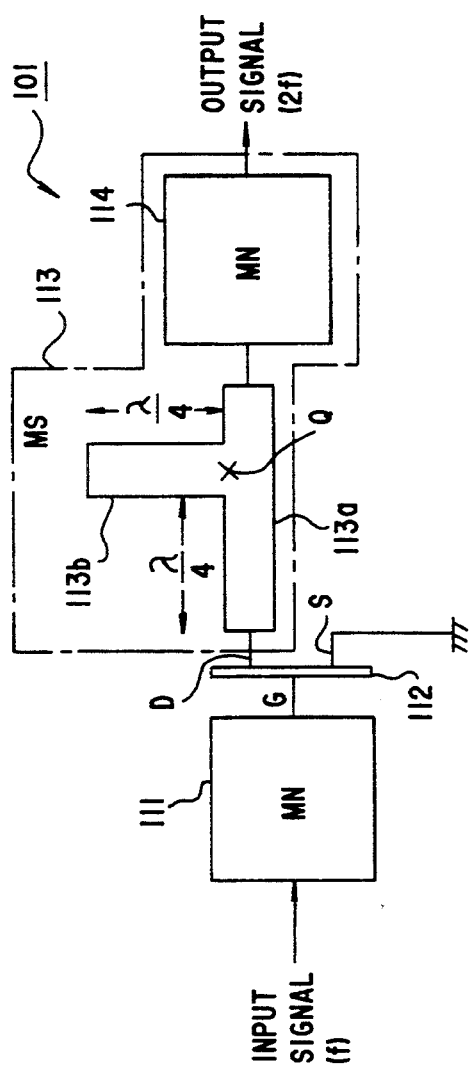
FIG. 1 is a block diagram of a usual frequency multiplier.
Figure 2:
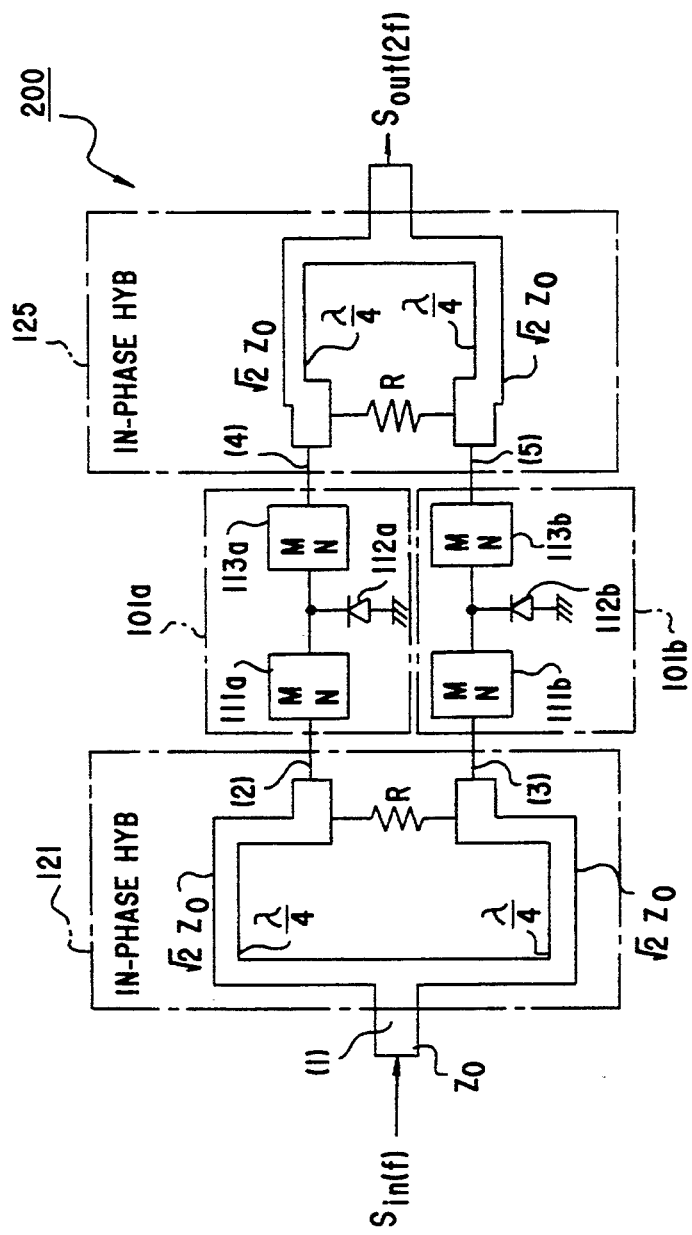
FIG. 2 is a block diagram of a power composed type frequency multiplier in the prior art.

The construction and function of FREQ MULT 21a are same as those of usual frequency multiplier 101 explained in reference to FIG. 1, except that no matching network is provided between terminal ④ and the gate electrode G of FET 211a for reducing the power loss due to the insertion of the matching network. The MN 212a includes a micro strip line and a matching network the same as MS 113 and MN 114 in FIG. 1, respectively. The FREQ MULT 21a produces an output signal specified by frequency 2f. Similar to FREQ MULT 21a, FREQ MULT 21b produces another output signal specified by frequency 2f. However, since the phase of the input signal to FREQ MULT 21b is delayed 90° from that input to FREQ MULT 21a, the phase of the output signal from FREQ MULT 21b is delayed 180° from that from FREQ MULT 21a.

The construction and function of branch-line type HYB 31 are the same as those of branch-line type HYB 11 except that terminals ③ and ④ are the input terminals and terminal ① is the output terminal of HYB 31. As in the case of the reflected signals in HYB 11, the phase of the input signal fed to terminal ③ is delayed 180° at terminal ① and the phase of the input signal fed to terminal ④ is delayed 90° at terminal ①. Therefore, the phase of the input signal at terminal ④ must be delayed 90° from the phase of the input signal at terminal ③ for composing the power of the input signals fed to terminals ③ and ④ at terminal ①.

Since the phase of the output signal from FREQ MULT 21b is delayed 180° from that from FREQ MULT 21a and the output signal from FREQ MULT 21b is directly sent to terminal ④, the phase of the output signal from FREQ MULT 21a must be delayed 90° more as the input signal to terminal ③ for making the phase of the input signal at terminal ④ delay 90° from that at terminal ③. This is performed by PHASE SHIFT 41 provided between FREQ MULT 21a and terminal ③ of HYB 31. Delaying the phase of the output signal from FREQ MULT 21a thus, the power of the frequency multiplied signals from FREQ MULTs 21a and 21b are composed, producing a power composed output signal $S_{out}$ (2f) specified by multiplied frequency 2f from terminal ① of HYB 31. In FIG. 4, the numerical value of the angular degree is indicated at terminals ④ and ③ of HYB 11, at the outputs of FREQ MULTs 21a and 21b, and terminals ①, ③ and ④ of HYB 31. The numerical value of the angular degree shows the phase relation among the signals appearing at those terminals. In FIG. 4, HYB 31 is depicted as smaller than HYB 11. This shows that HYB 31 is smaller than HYB 11 in size because the frequency of the signal treated in HYB 31 is 2f. The symbol λ' represents the wavelength of frequency 2f.

In HYB 31, when a reflected signal appears at terminal ①, the reflected signal is divided into two divided reflected signals output from terminal ④ and ③, the two signals having a 90° phase difference. Then, when the divided reflected signals output from terminal ④ and ③ are returned to terminal ④ and ③ because of signal reflection from FREQ MULTs 21b and 21a, the returned signals are input to terminals ④ and ③. However, the returned signals are cancelled out at terminal ① because of the phase relation between the returned signals, which is the same as the explanation on the reflected signals in HYB 11. As a result, the output impedance at terminal ① is stable, decreasing the power loss due to the impedance mismatch occurring in the prior art.

Figure 5:
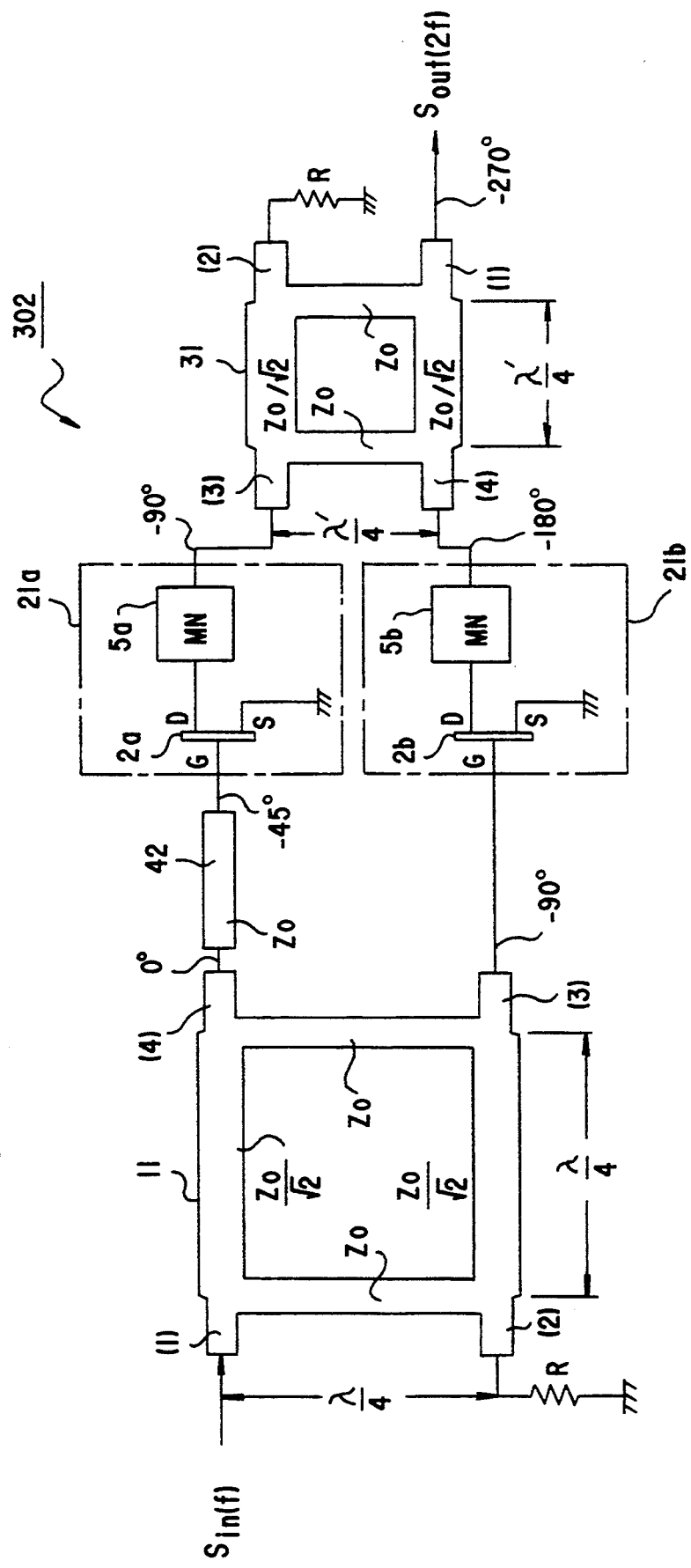
FIG. 5 is a block diagram of a power composed type frequency multiplier employing a second embodiment of the present invention.

FIG. 5 is a block diagram of POWER COMP FREQ MULT 302 in the second embodiment of the present invention. In FIG. 5, the same numeral as in FIG. 4 designates the same part as in FIG. 4. In FIG. 5, PHASE SHIFT 42 is a λ/8 length micro strip line provided between terminal ④ of HYB 11 and FREQ MULT 21a. Providing PHASE SHIFT 42 thus, the phase of the output signal from HYB 11 is shifted as much as 45°, so that the phase of the frequency multiplied signal output from FREQ MULT 21a is delayed an amount of 90° from the phase of the output signal from terminal ④ of HYB 11. Meanwhile, the phase of the frequency multiplied signal output from FREQ MULT 21b is delayed an amount of 180° from the phase of the output signal from terminal ④ of HYB 11. Since the frequency multiplied signal output from FREQ MULT 21a and that from FREQ MULT 21b are sent to terminals ③ and ④ of HYB 31 as the input signals to terminals ③ and ④, respectively, the phase of the input signal at terminal ④ is delayed 90° from that at terminal ③. As a result, in HYB 31, the power of the input signals at terminals ③ and ④ can be composed at terminal ① in-phase.

The input impedance at terminal ① of HYB 11 will be discussed. Since PHASE SHIFT 42 is placed between terminal ④ of HYB 11 and FREQ MULT 21a, a reflected signal from FREQ MULT 21a is delayed 90° at terminal ④, so that the phase of the reflected signal is delayed an amount of 180° at terminal ① of HYB 11. Meanwhile, a reflected signal from FREQ MULT 21b is delayed 90° at terminal ③ of HYB 11, so that the amount of phase delay of the reflected signal is 270° at terminal ① of HYB 11. Therefore, there is 90° phase difference between the reflected signal from FREQ MULT 21a and the reflected signal from FREQ MULT 21b at terminal ① of HYB 11. This teaches that at terminal ① of HYB 11, though the reflected signals are not cancelled out as in the first embodiment, the reflected signal is reduced, compared with the case of the prior art explained in reference to FIG. 2.

Meanwhile, the output impedance of HYB 31 in FIG. 5 is matched as in the first embodiment.

Therefore, in the second embodiment, the power loss produced is somewhat larger than in the first embodiment, due to the input impedance mismatch. However, the amount of the power loss is less than that in the prior art. As a result, the power loss is decreased in the second embodiment in comparison with the prior art.

Figure 6:
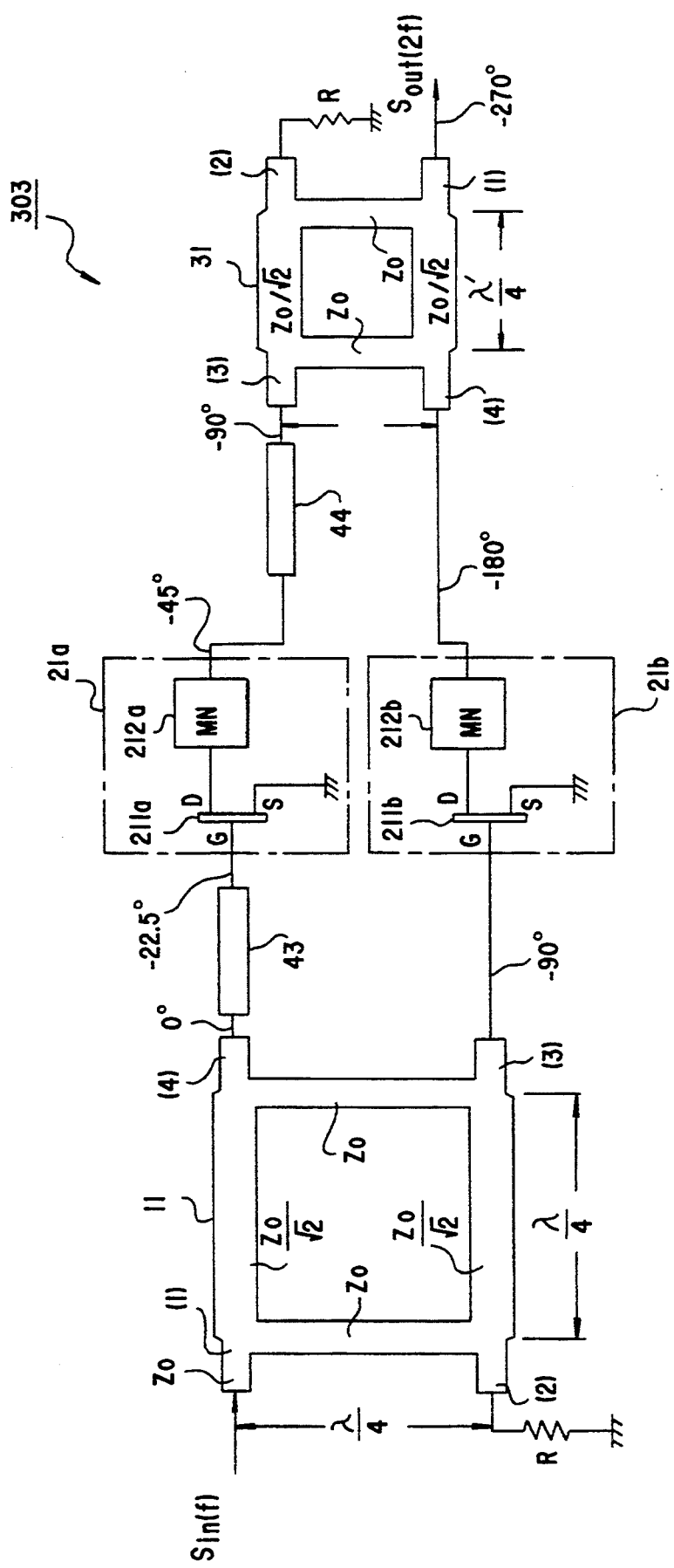
FIG. 6 is a block diagram of a power composed type frequency multiplier employing a third embodiment of the present invention.

FIG. 6 is a block diagram of POWER COMP FREQ MULT 303 in the third embodiment of the present invention. In FIG. 6, the same reference numeral as in FIG. 5 designates the same part as in FIG. 5. In the third embodiment, PHASE SHIFT 43 made of a micro strip line having a length of λ/16 is provided between terminal ④ of HYB 11 and FREQ MULT 21a and PHASE SHIFT 44 made of a micro strip line having a length of λ/8 is provided between FREQ MULT 21a and terminal ③ of HYB 31. Providing the PHASE SHIFTs 43 and 44 thus, the phase of the input signal at terminal ④ of HYB 31 can be delayed as much as 90° from the phase of the input signal at terminal ③ of HYB 31.

Regarding the input impedance of HYB 11, it will be clear that the input impedance is more stable than that in the second embodiment. Because, the phase of the reflected signal from FREQ MULT 21a is delayed 45° which is less than 90° in case of the second embodiment. Therefore, in the third embodiment, the power loss due to the input impedance mismatch is not as severe as in the second embodiment.

Figure 7:
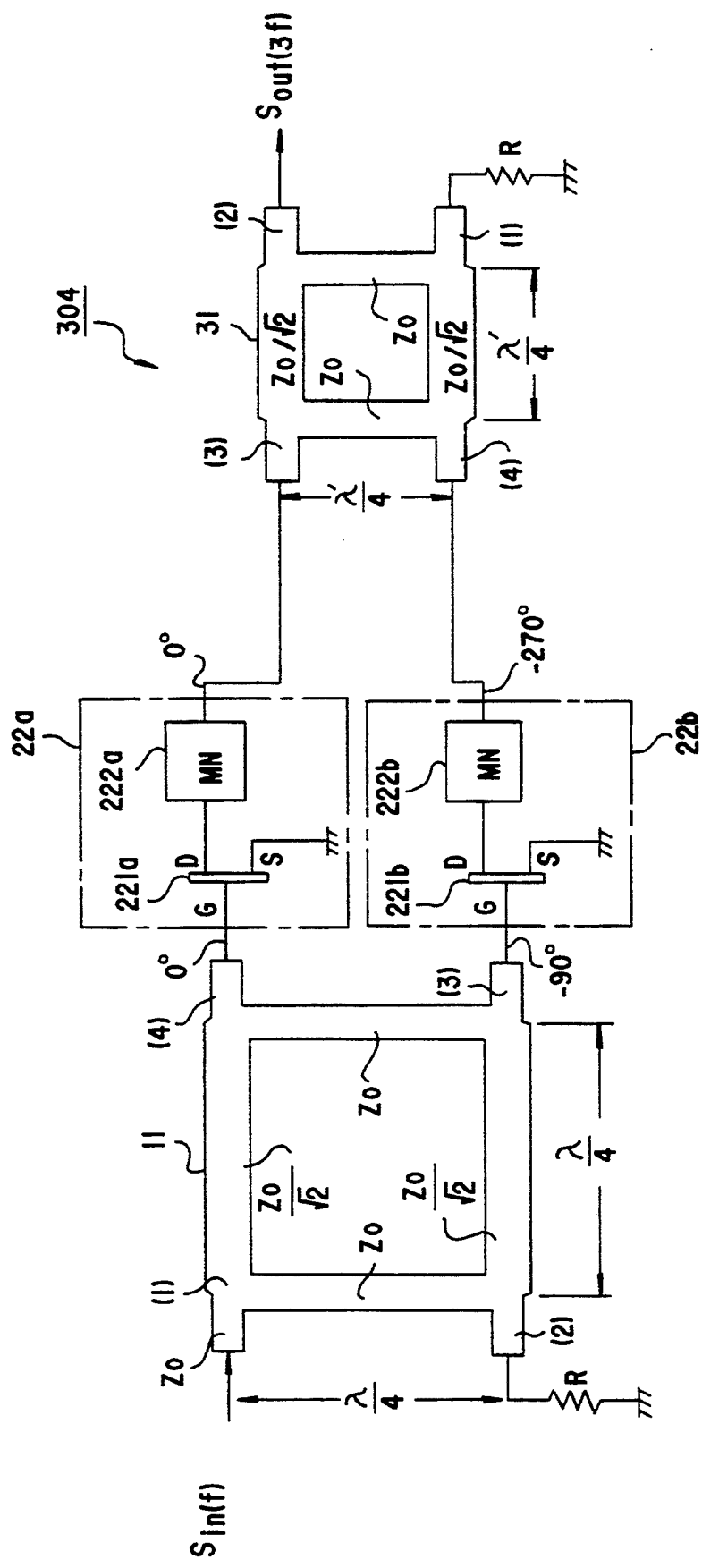
FIG. 7 is a block diagram of a power composed type frequency multiplier employing a fourth embodiment of the present invention.

The first, second and third embodiments explained above are based on the double frequency multiplication. FIG. 7 is a block diagram of a power composed type frequency multiplier 304 in the fourth embodiment of the present invention, based on the triple frequency multiplication. In FIG. 7, the same reference numeral as in FIG. 6 designates the same part as in FIG. 6. In FIG. 7, FREQ MULTs 22a and 22b consist of the same components of FREQ MULTs 21a and 21b, respectively, except that FREQ MULTs 22a and 22b produce output signals specified by frequency 3f respectively when a signal specified by frequency f is input to FREQ MULTs 22a and 22b respectively. As explained in reference to FIG. 3, when HYB 11 receives input signal $S_{in}$ (f) specified by frequency f, the power of $S_{in}$ (f) is divided and output signals are produced from terminals ③ and ④ so that the phase of the output signal from terminal ③ is delayed as much as 90° from the phase of the output signal from terminal ④. The FREQ MULTs 22a and 22b produce the frequency multiplied signals specified by frequency 3f respectively, so that the phase of the output signal from FREQ MULT 22b is delayed as much as 270° from that from FREQ MULT 22a. The output signals from FREQ MULTs 22a and 22b are directly input to terminals ③ and ④ of HYB 31, respectively.

In HYB 31, terminal ② is the output terminal of HYB 31. Therefore, the phase of the input signal at terminal ③ is delayed as much as 90° at terminal ② and the phase of the input signal at terminal ④ is delayed as much as 180° at terminal ②. Since the phase of the input signal at terminal ④ is delayed 270° from that at terminal ③, the phase of the input signal at terminal ④ is delayed as much as 450° at terminal ②. The 450° delay effectively represents a 90° delay, in other words, the power of the output signals from FREQ MULTs 22a and 22b can be composed in-phase without any phase shifter between HYBs 11 and 31.

In FIG. 7, because of the same reason as explained in the first embodiment in reference to FIG. 4, the input and output impedance is stable, so that the power loss is reduced as much as in the first embodiment.

Figure 8:
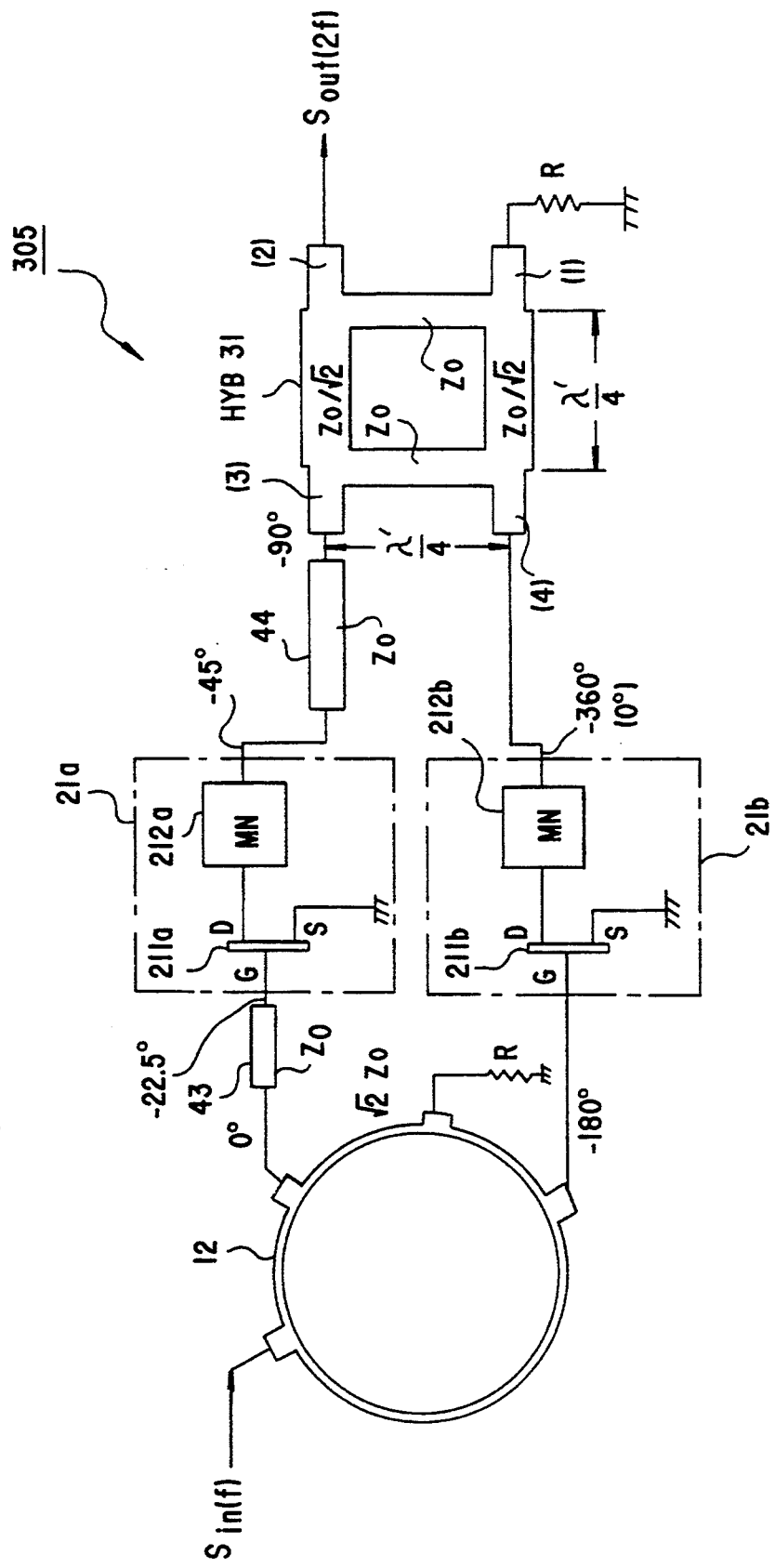
FIG. 8 is a block diagram of a power composed type frequency multiplier employing a fifth embodiment of the present invention.
Figure 9:
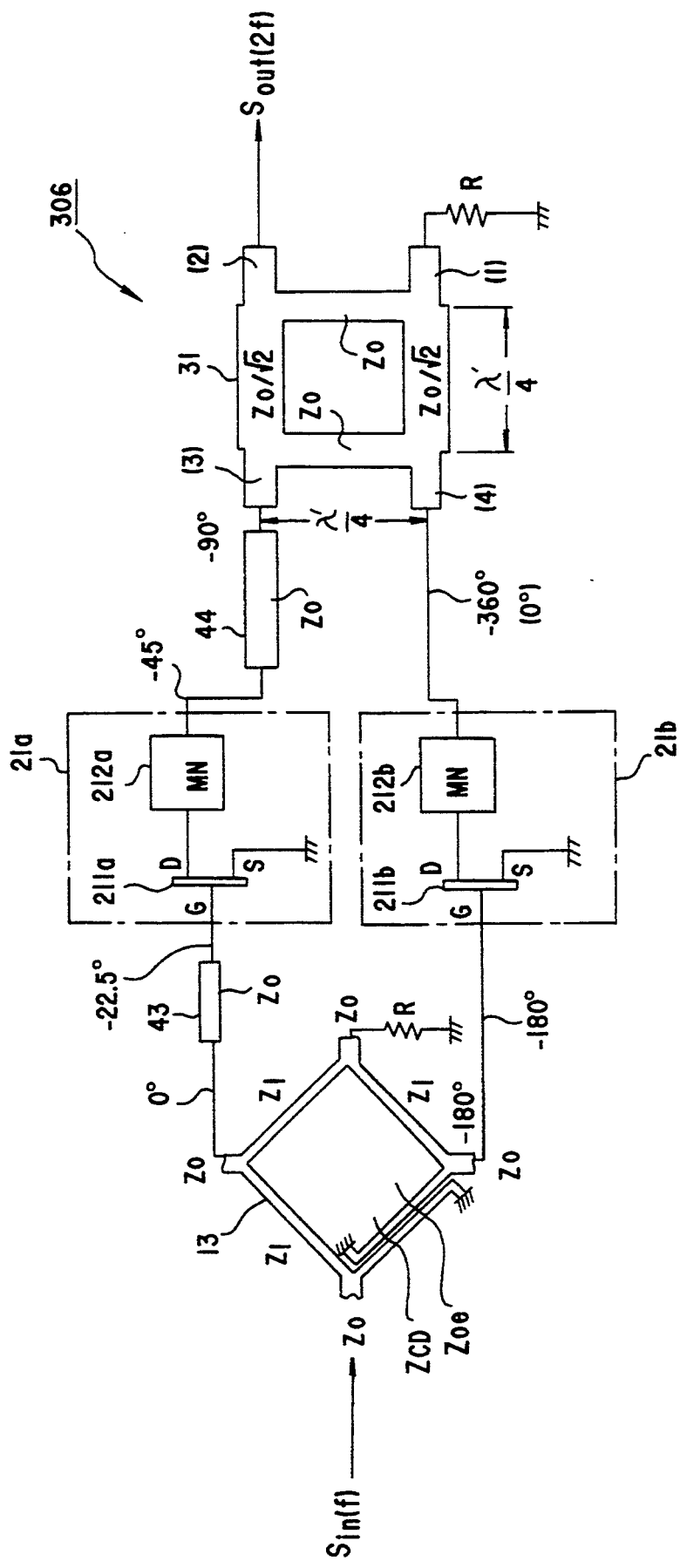
FIG. 9 is a block diagram of a power composed type frequency multiplier employing a sixth embodiment of the present invention.

In the above first, second, third and fourth embodiments, the branch-line type HYB is used as the out-of-phase HYB respectively. However, a well known rat race type HYB and a well known reversed phase type HYB can be used as the out of-phase input HYB. FIGS. 8 and 9 are block diagrams of POWER COMP FREQ MULT 305 and 306 used in the fifth and sixth embodiments of the present invention, respectively. In FIGS. 8 and 9, the same reference numeral as in FIG. 7 designates the same part as in FIG. 7 and the phase relation is represented by the numerical value of angular degree at the input and output points of each box. In FIGS. 8 and 9, providing PHASE SHIFT 43 for delaying 22.5° at frequency f and PHASE SHIFT 44 for delaying 45° at frequency 2f is the same as in the third embodiment, explained in reference to FIG. 6. The effect of a rat race type HYB 12 on the input impedance matching in FIG. 8 and the effect of a reversed phase type HYB 13 on the input impedance matching in FIG. 9 are the same as the effect of branch-line type HYB 11 on the input impedance matching in the third embodiment as explained in reference to FIG. 6, respectively.

We claim:

1. A power composed type frequency multiplier comprising:

an out-of-phase type input hybrid coupler for dividing an input signal having input power and specified by an input frequency, into divided signals each having half of the input power and specified by the input frequency respectively and having a predetermined difference in phase;

frequency multipliers connected with said input hybrid coupler, for multiplying the input frequency of the divided signal respectively, by producing frequency multiplied signals specified by a multiplied frequency respectively; and an out-of-phase type output hybrid coupler connected with said frequency multipliers, for composing power of the frequency multiplied signals and producing the same predetermined difference in phase in the frequency multiplied signals as produced by said input hybrid coupler, by producing an output signal having composed power and specified by the multiplied frequency.

2. A power composed type frequency multiplier according to claim 1, wherein the multiplied frequency is twice that of the input frequency.

3. A power composed type frequency multiplier according to claim 2, wherein said input hybrid coupler and said output hybrid coupler both comprise a branch line type hybrid coupler.

4. A power composed type frequency multiplier according to claim 3 further comprising at least one phase shifter provided between said input hybrid coupler and said output hybrid coupler, for varying a phase difference between the frequency multiplied signals so as to make said output hybrid coupler compose the frequency multiplied signals in-phase.

5. A power composed type frequency multiplier according to claim 4, wherein said phase shifter is provided between one of said frequency multipliers and said output hybrid coupler.

6. A power composed type frequency multiplier according to claim 4, wherein said phase shifter is provided between said input hybrid coupler and one of said frequency multipliers.

7. A power composed type frequency multiplier according to claim 4, wherein said phase shifter is provided between said input hybrid coupler and one of said frequency multipliers and between said one of said frequency multipliers and said output hybrid coupler, respectively.

8. A power composed type frequency multiplier according to claim 1, wherein the multiplied frequency is three times that of the input frequency.

9. A power composed type frequency multiplier according to claim 8, wherein said input hybrid coupler and said output hybrid coupler both comprise a branch line type hybrid coupler.

10. A power composed type frequency multiplier according to claim 2, wherein said input hybrid coupler comprises a rat race type hybrid coupler, said output hybrid coupler comprises a branch line type hybrid coupler and a phase shifter is provided between said input hybrid coupler and one of said frequency multipliers and between said one of said frequency multipliers and said output hybrid coupler, respectively.

11. A power composed type frequency multiplier according to claim 2, wherein said input hybrid coupler comprises a reversed phase type hybrid coupler, said output hybrid coupler comprises a branch line type hybrid coupler and a phase shifter is provided between said input hybrid coupler and one of said frequency multipliers and between said one of said frequency multipliers and said output hybrid coupler, respectively.

12. A power composed type frequency multiplier according to claim 4, wherein said phase shifter comprises a micro strip line behind which a grounded electric conductor is laid.

* * * * *

UNITED STATES PATENT AND TRADEMARK OFFICE
CERTIFICATE OF CORRECTION

PATENT NO. : 5,392,014
DATED : February 21, 1995
INVENTOR(S) : NISHIDA et al.

It is certified that error appears in the above-indentified patent and that said Letters Patent is hereby corrected as shown below:

On the cover page, item [57], the last line, "in in-phase" should read --in-phase--.

Column 3, line 32, "and G is fails" should --and the gate electrode G fails--.

| | | |
|---|---|---|
| Column 2, line 45, | change "①" to --(1)--; |
| line 47, | change "② and ③" to --(2) and (3)--; |
| line 49, | change "② and ③" to --(2) and (3)--; |
| line 56, | change "①" to --(1)--; |
| line 58, | change "② and ③" to --(2) and (3)--; |
| line 60, | change "② and ③" to --(2) and (3)--; |
| line 62, | change "② and ③" to --(2) and (3)--; |
| Column 3, line 8, | change "④ and ⑤" to --(4) and (5)--; |
| line 17, | change "② and ③" to --(2) and (3)--; |
| line 21, | change "①" to --(1)--; |
| Column 5, line 42, | change "①" to --(1)--; |
| line 46, | change "②" to --(2)--; |
| line 47, | change "④ and ③" to --(4) and (3)--; |

UNITED STATES PATENT AND TRADEMARK OFFICE
CERTIFICATE OF CORRECTION

PATENT NO. : 5,392,014
DATED : February 21, 1995
INVENTOR(S) : NISHIDA et al.

It is certified that error appears in the above-indentified patent and that said Letters Patent is hereby corrected as shown below:

| | | |
|---|---|---|
| Column 5, line 50, | change "④" to | --(4)--; |
| line 51, | change "③" to | --(3)--; |
| line 52, | change "③" to | --(3)--; |
| line 53, | change "④" to | --(4)--; |
| line 54, | change "④ and ③" to | --(4) and (3)--; |
| line 55, | change "④ and ③" to | --(4) and (3)--; |
| line 56, | change "③" to | --(3)--; |
| line 57, | change "④" to | --(4)--; |
| line 58, | change "④" to | --(4)--; |
| line 60, | change "③" to | --(3)--; |
| line 60, | change "①" to | --(1)--; |
| line 61, | change "①" to | --(1)--; |
| line 62, | change "④ and ③" to | --(4) and (3)--; |
| line 64, | change "①" to | --(1)--; |
| line 65, | change "②" to | --(2)--; |
| Column 6, line 6, | change "④" to | --(4)--; |

UNITED STATES PATENT AND TRADEMARK OFFICE
CERTIFICATE OF CORRECTION

Page 3 of 7

PATENT NO. : 5,392,014
DATED : February 21, 1995
INVENTOR(S) : NISHIDA et al.

It is certified that error appears in the above-indentified patent and that said Letters Patent is hereby corrected as shown below:

| | | |
|---|---|---|
| Column 6, line 21, | change "③ and ④" to | --(3) and (4)--; |
| line 22, | change "①" to | --(1)--; |
| line 24, | change "③" to | --(3)--; |
| line 25, | change "①" to | --(1)--; |
| line 26, | change "④" to | --(4)--; |
| line 26, | change "①" to | --(1)--; |
| line 27, | change "④" to | --(4)--; |
| line 29, | change "③" to | --(3)--; |
| line 30, | change "③ and ④" to | --(3) and (4)--; |
| line 30, | change "①" to | --(1)--; |
| line 34, | change "④" to | --(4)--; |
| line 36, | change "③" to | --(3)--; |
| line 37, | change "④" to | --(4)--; |
| line 38, | change "③" to | --(3)--; |
| line 40, | change "③" to | --(3)--; |
| line 45, | change "①" to | --(1)--; |

UNITED STATES PATENT AND TRADEMARK OFFICE
CERTIFICATE OF CORRECTION

PATENT NO. : 5,392,014
DATED : February 21, 1995
INVENTOR(S) : NISHIDA et al.

It is certified that error appears in the above-indentified patent and that said Letters Patent is hereby corrected as shown below:

Column 6, line 47,     change "④ and ③" to --(4) and (3)--;

line 48,     change "① , ③" to --(1),(3)--;

line 49,     change "④" to --(4)--;

line 57,     change "①" to --(1)--;

line 58,     change "④ and ③" to --(4) and (3)--;

line 60,     change "④" to --(4)--;

line 61,     change "③" to --(3)--;

line 61,     change "④ and ③" to --(4) and (3)--;

line 63,     change "④ and ③" to --(4) and (3)--;

line 65,     change "①" to --(1)--;

line 68,     change "①" to --(1)--;

Column 7, line 8,     change "④" to --(4)--;

line 14,     change "④" to --(4)--;

line 17,     change "④" to --(4)--;

line 20,     change "③ and ④" to --(3) and (4)--;

line 21,     change "③ and ④" to --(3) and (4)--;

UNITED STATES PATENT AND TRADEMARK OFFICE
CERTIFICATE OF CORRECTION

PATENT NO. : 5,392,014
DATED : February 21, 1995
INVENTOR(S) : NISHIDA et al.

It is certified that error appears in the above-indentified patent and that said Letters Patent is hereby corrected as shown below:

```
Column 7, line 22,      change "④" to --(4)--;

line 23,       change "③" to --(3)--;

line 24,       change "③ and ④" to --(3) and (4)--;

line 25,       change "①" to --(1)--;

line 26,       change "①" to --(1)--;

line 28,       change "④" to --(4)--;

line 30,       change "④" to --(4)--;

line 31,       change "①" to --(1)--;

line 33,       change "③" to --(3)--;

line 35,       change "①" to --(1)--;

line 38,       change "①" to --(1)--;

line 39,       change "①" to --(1)--;

line 57,       change "④" to --(4)--;

line 60,       change "③" to --(3)--;

line 62,       change "④" to --(4)--;

line 63,       change "③" to --(3)--;
```

UNITED STATES PATENT AND TRADEMARK OFFICE
CERTIFICATE OF CORRECTION

Page 6 of 7

PATENT NO. : 5,392,014
DATED : February 21, 1995
INVENTOR(S) : NISHIDA et al.

It is certified that error appears in the above-indentified patent and that said Letters Patent is hereby corrected as shown below:

Column 8, line 21, change "③ and ④" to --(3) and (4)--;

line 22, change "③" to --(3)--;

line 23, change "④" to --(4)--;

line 29, change "③ and ④" to --(3) and (4)--;

line 31, change "②" to --(2)--;

line 33, change "③" to --(3)--;

line 33, change "②" to --(2)--;

line 34, change "④" to --(4)--;

UNITED STATES PATENT AND TRADEMARK OFFICE
CERTIFICATE OF CORRECTION

PATENT NO. : 5,392,014
DATED : February 21, 1995
INVENTOR(S) : Nishida et al.

It is certified that error appears in the above-indentified patent and that said Letters Patent is hereby corrected as shown below:

Column 8, line 35,   change "②" to --(2)--;

line 36,   change "④" to --(4)--;

line 37,   change "③" to --(3)--;

line 38,   change "④" to --(4)--;

line 38,   change "②" to --(2)--.

Signed and Sealed this

Twenty-seventh Day of June, 1995

Attest:

BRUCE LEHMAN

*Attesting Officer*   *Commissioner of Patents and Trademarks*